United States Patent [19]

Stein et al.

[11] Patent Number: 5,071,491
[45] Date of Patent: Dec. 10, 1991

[54] FRAME FOR SOLAR CELL DEVICES

[75] Inventors: Karl U. Stein, Unterhaching; Fritz Cammerer, Munich, both of Fed. Rep. of Germany

[73] Assignee: Siemens Aktiengesellschaft, Berlin and Munich, Fed. Rep. of Germany

[21] Appl. No.: 448,920

[22] Filed: Dec. 12, 1989

[30] Foreign Application Priority Data

Dec. 12, 1988 [EP] European Pat. Off. ........ 88120734.4

[51] Int. Cl.$^5$ .................. H01L 31/05; H01L 31/048
[52] U.S. Cl. ..................................... 136/251; 136/244
[58] Field of Search ................................. 136/244, 251

[56] References Cited

U.S. PATENT DOCUMENTS

| | | | |
|---|---|---|---|
| 4,067,764 | 1/1978 | Walker et al. | 156/267 |
| 4,224,081 | 9/1980 | Kawamura et al. | 136/251 |
| 4,231,807 | 11/1980 | Keeling et al. | 136/251 |
| 4,392,009 | 7/1983 | Napoli | 136/251 |
| 4,401,839 | 8/1983 | Pyle | 136/251 |
| 4,433,200 | 2/1984 | Jester et al. | 136/251 |
| 4,567,316 | 1/1986 | Hollaus et al. | 136/246 |

FOREIGN PATENT DOCUMENTS

| | | | |
|---|---|---|---|
| 0121095 | 1/1989 | European Pat. Off. | 136/246 |
| 2942328A1 | 4/1981 | Fed. Rep. of Germany | 136/251 |
| 3111969A1 | 10/1982 | Fed. Rep. of Germany | 136/244 |
| 3617675A1 | 12/1986 | Fed. Rep. of Germany | 136/244 |
| 56-12781 | 2/1981 | Japan | 136/251 |
| 58-63181 | 4/1983 | Japan | 136/251 |
| 2031224 | 9/1979 | United Kingdom | 136/251 |

OTHER PUBLICATIONS

Japanese Patent Abstracts, vol. 9, No. 291 (E-359) (2014) Nov. 19, 1985, Amorphous Silicon Solar Cell (60-130868).

*Primary Examiner*—Aaron Weisstuch
*Attorney, Agent, or Firm*—Hill, Van Santen, Steadman & Simpson

[57] ABSTRACT

A frame for securing solar cell equipment in a solar generator and carrying solar generated current. The current carrying frame reduces the number of interconnections required in the overall device. As a result, the present invention is simpler and requires considerably less outlay than conventional solar generators.

8 Claims, 3 Drawing Sheets

FRAME FOR SOLAR CELL DEVICES

BACKGROUND OF THE INVENTION

1. Field of the Invention

The invention relates to frame apparatuses for securing solar cell equipment.

2. Description of the Prior Art

Known solar cell equipment has a frame that can serve various purposes, such as edge protection, increasing mechanical stability, protection against moisture and provide local fastening of the solar cell equipment. However, such a frame requires considerable outlay when adapted to carry currents.

SUMMARY OF THE INVENTION

An object of the present invention is to provide solar cell equipment including a frame that can carry the current generated in the solar cell equipment.

The object is achieved in solar cell equipment including a frame constructed according to the principles of the present invention. The cross-section of the frame of the present invention can be designed to be adequately large and can, thus, easily pick up the high electrical currents generated in the solar cell equipment.

The invention reduces the number of interconnections needed within each solar cell module. The field cabling may also be reduced as a result of the invention. Individual solar cell devices can be directly interconnected to one another. A simple structure of parallel and/or series circuits of solar cell devices may be realized with the invention. Devices that include an individual solar cell or solar cell module that can be provided with frame means can be employed as solar cell equipment.

Solar modules that are manufactured using double glass technology can be employed as solar cell equipment. In double glass technology, the solar cells and their electrical wiring are embedded between two glass panes with plastic in its molten form or thermoplastic foil material.

Solar modules that have been manufactured using superstrate technology can also be employed as solar cell equipment. A glass pane is similarly used as covering at the front side of a solar module, while the back of the solar module is constructed of plastic or aluminum-coated films. The solar cells and respective electrical wiring are embedded between the front side and backside of the solar module with the assistance of thermoplastic films. Methods for manufacturing such solar modules are recited, for example, in U.S. Pat. Nos. 4,067,764, 4,224,081, 4,231,807, 4,371,739, 4,433,200 and 4,401,839.

The frame of solar cell equipment is usually constructed of aluminum or steel members and may be sealed with silicone.

A solar module, as disclosed in U.S. Pat. No. 4,567,316 and in corresponding European Patent No. 012,095, can be employed in the present invention. In this solar cell module, individual solar cells are arranged in rows that are partially electrically connected in series. As required, bypass diodes are connected parallel to these serially connected solar cells to limit the heating of solar cells that are partially shaded from the sun.

In the present invention, these bypass diodes are directly integrated into the solar cell module, so that a complex junction box for these bypass diodes will not be required. In the present invention, only two terminals from the solar cell module are needed.

For optimum performance, solar cell equipment is mechanically stabilized with the assistance of glass panes or with the assistance of glass fibers. This equipment is further provided with a frame for carrying current that has been generated in the solar cell equipment.

Solar cell equipment that requires a minimum of electrical wiring are employed in the present invention. For example, solar cells can be mechanically stabilized with the assistance of a substrate or superstrate, whereby the substrate or, respectively, the superstrate comprise electrically conductive regions such as metallizations or electrically conductive plastics. Electrical connection is, as a result, provided between solar cells and between solar cells and an electrically conductive frame.

The frame structure can remove current from number of solar cells of the solar cell equipment. Also, the frame may remove current from only a single solar cell. The frame structure may be composed of metal or an electrically conductive plastic or of a combination of metal and an electrically conductive plastic.

The frame structure can be manufactured with a multipole design with an insulator using standard window technology. Such a design reduces heat transmission in metal window frames and provides thermal and electrical insulation.

Solar cells can be directly connected to the frame of the present invention in an electrically conductive fashion. Solar cells can also be provided with electrically conductive connectors, such as straps or other electrically conductive wirings, and can be electrically connected to one another and/or to the frame with such connectors.

Electrical connections required in solar cell equipment having a frame of the invention can be produced by solder joints, weld joints, clamps, electrically conductive adhesives or by similar techniques known to a person skilled in the art. Conductive rubber compounds and electrically conductive sealing compounds are also suitable for current conduction to the actual frame structure.

Electrical connections between solar cells or connections between a solar cell and the frame can be formed with with electrically conductive foils, electrically conductive metallizations or with electrically conductive plastic. Electrical connections between solar cells or connections between solar cells and the frame structure can be produced by employing printed circuit board technology.

Solar cell equipment including a frame of the present invention can be framed on two sides, on all sides or at only parts of its edges. Various electrically conductive frame parts may be separated by electrically insulating frame parts.

The solar cells inside the solar cell equipment can be interconnected in parallel and/or in series.

DETAILED DESCRIPTION OF THE PREFERRED EMBODIMENTS

Figure 1:
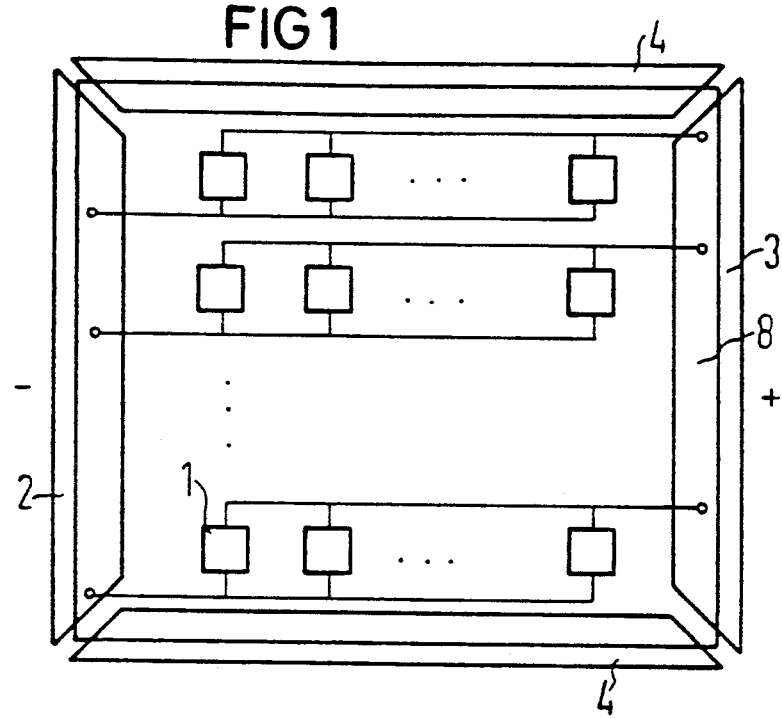
FIG. 1 shows solar cell equipment including a frame of the present invention.

FIG. 1 shows solar cell equipment including solar cells 1. The frame parts 2, 3 are electrically conductive and the frame parts 4 are electrically insulated from the frame parts 2, 3. The frame parts 4 can also serve for electrical insulation between the frame parts 2 and 3. The parallel connected solar cells 1 and the frame parts 2, 3 are interconnected so that frame part 2 forms the negative pole of the overall solar cell equipment and the frame part 3 forms the positive pole of the overall solar cell equipment.

The solar cells 1 may be electrically connected to one another with the assistance of additional electrical wiring. The solar cells 1 may also be directly connected to one another via electrically conductive regions on the substrate or superstrate. The solar cells 1 can be abutted against each other edge to edge.

Figure 2:
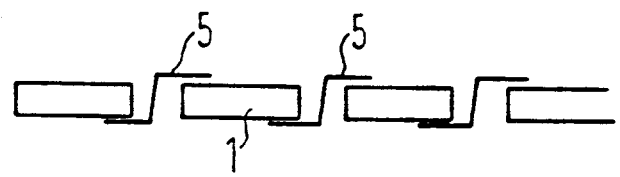
FIG. 2 illustrates the direct electrical interconnection of solar cells.

FIG. 2 shows solar cells 1 that are electrically connected to one another in series with the assistance of electrical conductive devices 5, such as straps.

Figure 3:
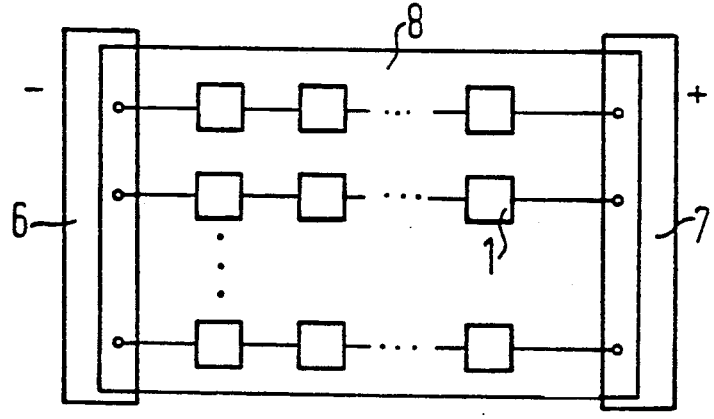
FIG. 3 shows another arrangement of solar cell equipment including a frame of the present invention.

FIG. 3 shows solar cell equipment including frame parts 6, 7 with solar cells 1 wired in series by row. Entire rows of these serially interconnected solar cells 1 are then connected in parallel. The solar cell equipment of FIG. 3 has only two frame parts 6, 7. The frame part 6 forms the negative pole and the frame part 7 forms the positive pole.

In FIG. 1 and FIG. 3, a glass pane 8 may be employed as a substrate or superstrate.

Profiled parts that can be manufactured as continuously cast parts or as extruded parts can be employed as frame parts in the invention.

Figure 4:
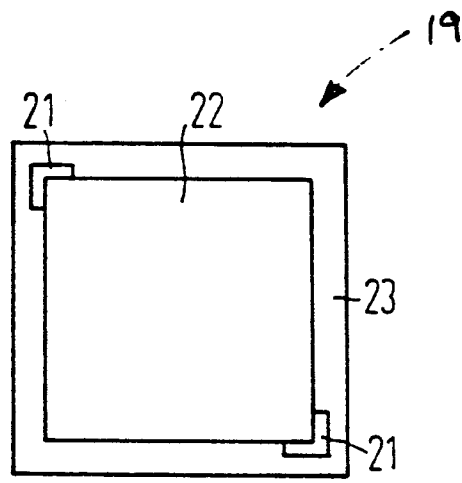
FIG. 4 shows a plan view of a solar module without the frame of the present invention.

FIG. 4 shows a plan view of a solar module without a frame of the invention. The solar cells (not shown in FIG. 4) are covered with a thermoplastic film 22. The solar module 19 has a glass pane 23 as superstrate. The electrical connection between the solar cells of the solar module 19 and the frame, according to the invention, to be attached thereto according to the invention is achieved with metallized surfaces 21 on the glass 23.

Figure 5:
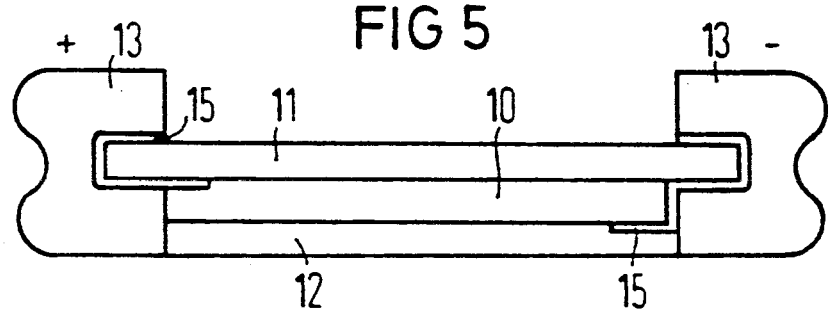
FIG. 5 shows a cross-sectional view of a single solar cell and the frame of the invention.
Figure 6:
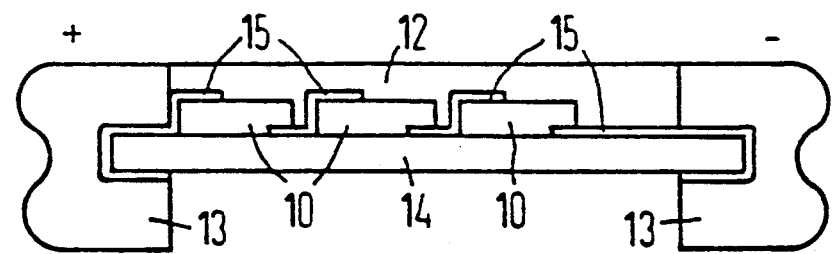
FIG. 6 shows a cross-sectional view of a solar module and the frame of the invention.

FIG. 5 shows a single solar cell 10. A glass pane 11 is used as superstrate. The glass pane 11 and the solar cell 10 is provided with two frame parts 13. The two frame parts 13 are elastically pressed onto the glass pane 11 or placed onto the glass pane 11 and screwed down. The frame parts can also be composed of electrically conductive plastic. The frame parts 13 are directly electrically connected to the solar cell 10 via electrical connections 15. The electrical connections 15 can be electrically conductive foils, metallizations or conductive plastic. FIG. 6 shows a solar module that is constructed similar to the solar cell equipment of FIG. 5. The solar module of FIG. 6 has a number of solar cells 10. Instead of the glass pane 11, a substrate 14 (circuit board) is provided in FIG. 6. The solar cells 10 in FIGS. 5 and 6 can be covered with plastic 12.

In solar cell equipment of the invention, a junction box can be omitted. Bypass diodes can be directedly integrated into the solar cell equipment or integrated into the frame of the invention.

The frame for carrying current can also be composed of several current-carrying frame parts.

For manufacturing the frame, the edging of the solar cell equipment can be entirely or partially coated with plastic. This plastic can be electrically conductive.

The metallic frame profile may be additionally provided with electrical insulation that is known in the solar cell equipment technology and used in sections for manufacturing the frame structure.

Figure 7:
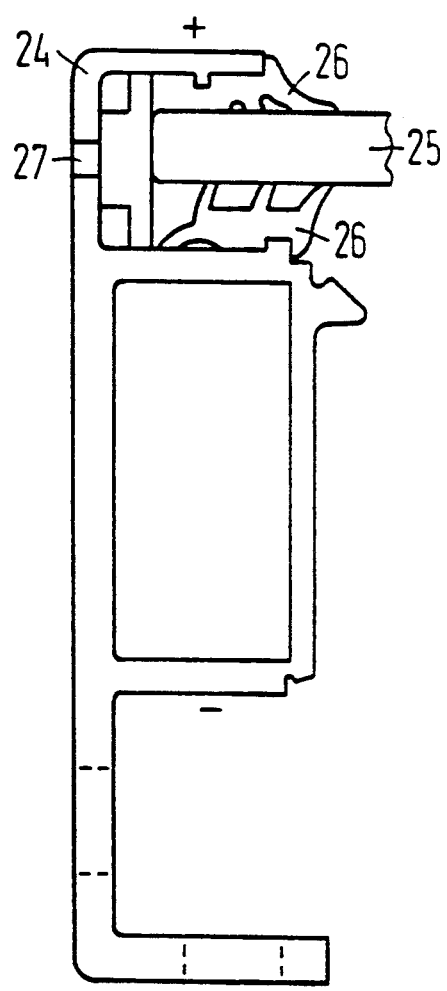
FIG. 7 shows a cross-sectional view of another embodiment of the present invention.

FIG. 7 shows a known metallic frame 24 that is used for framing a glass-plastic composite solar cell equipment 25. The electrical contact between frame means 24 and solar cell equipment 25 is provided by electrically conductive rubber or plastic seals 26. The seals 26 need not necessarily be conductive. However, the seals 26 can also include the electrically conductive contact.

The electrically conductive frame can be extruded. The frame 24 is preferably composed of aluminum. The frame 24 can include an electrical insulation 27. The positive pole can be situated in the upper part of the frame 24 and the negative pole can be situated in the lower part of the frame 24.

We claim as our invention:

1. A solar cell generator, comprising:
a plurality of solar cells mounted on a support; and
a frame externally surrounding said solar cells mechanically connected to said support and electrically connected to said solar cells, said frame consisting of a plurality of frame elements, at least two of said frame elements consisting of electrically conductive material and ben separated by electrically insulating material, each frame element disposed externally accessible to simultaneously mechanically stabilize said solar cell generator and to carry current generated in said solar cells.

2. A solar cell generator as claimed in claim 1, wherein said at least two frame elements are composed of electrically conductive plastic.

3. A solar cell generator as claimed in claim 1, wherein sad at least two frame elements are composed of electrically conductive metal.

4. A solar cell generator as claimed in claim 1, wherein said frame has a positive pole and a negative pole formed by respective ones of said electrically conductive frame elements.

5. A solar cell generator as claimed in claim 1, wherein at least one of said solar cells is electrically connected to said frame by electrically conductive straps.

6. A solar cell generator as claimed in claim 1, wherein at least one of said solar cells is electrically connected to said frame by an electrically conductive material situated on a superstrate support.

7. A solar cell generator as claimed in claim 1, wherein at least one of said solar cells is disposed on a substrate support and electrically connected to said frame by an electrically conductive material disposed on said substrate.

8. A solar cell generator as claimed in claim 1 wherein said electrically insulating material is formed by further ones of said plurality of frame elements, consisting of electrically insulating material, disposed between said frame elements consisting of electrically conductive material.

* * * * *